US007773025B2

(12) United States Patent
Holly et al.

(10) Patent No.: US 7,773,025 B2
(45) Date of Patent: Aug. 10, 2010

(54) REMOTE CIRCUIT INTERACTION

(75) Inventors: Sandor Holly, Woodland Hills, CA (US); Steven B. Pickard, Guntersville, AL (US)

(73) Assignee: The Boeing Company, Chicago, IL (US)

( * ) Notice: Subject to any disclaimer, the term of this patent is extended or adjusted under 35 U.S.C. 154(b) by 407 days.

(21) Appl. No.: 12/022,891

(22) Filed: Jan. 30, 2008

(65) Prior Publication Data

US 2009/0189091 A1 Jul. 30, 2009

(51) Int. Cl.

*G01S 7/38* (2006.01)
*G21K 5/00* (2006.01)
*G01R 27/28* (2006.01)

(52) U.S. Cl. .......................... 342/13; 342/14; 342/173; 324/624; 250/492.1

(58) Field of Classification Search ............. 342/13-15, 342/173, 174; 250/429.1; 324/627

See application file for complete search history.

(56) References Cited

U.S. PATENT DOCUMENTS

| | | | | |
|---|---|---|---|---|
| 6,359,444 | B1 * | 3/2002 | Grimes | 324/633 |
| 7,142,147 | B2 | 11/2006 | Holly | |
| 7,456,744 | B2 * | 11/2008 | Kuhns et al. | 340/572.1 |
| 2008/0012579 | A1 * | 1/2008 | Kuhns et al. | 324/652 |

* cited by examiner

*Primary Examiner*—John B Sotomayor
(74) *Attorney, Agent, or Firm*—Haynes and Boone, LLP

(57) ABSTRACT

A method and system for remotely affecting electronics within a conductive enclosure are disclosed. The method can comprise transmitting electromagnetic radiation of two different frequencies to the enclosure. The two different frequencies can be selected such that they penetrate the enclosure and therein form electromagnetic radiation of a third frequency that resonates within the enclosure. The third frequency can interact with the electronics, such as to disrupt operation thereof.

20 Claims, 4 Drawing Sheets

REMOTE CIRCUIT INTERACTION

TECHNICAL FIELD

The present invention relates generally to electrical circuits and, more particularly, to a method and system for remotely interacting with electrical circuits that are shielded, e.g., enclosed within a metal box.

BACKGROUND

Faraday cages are well known. Faraday cages are enclosures, such as boxes, that are made of a conductive material, such as metal. Sensitive electronics are frequently packaged within such metal enclosures to isolate them from electromagnetic radiation that would otherwise have a detrimental effect thereon.

As long as the walls of the enclosure are thick enough (many times the skin-depth) and the box is completely closed (has no gaps or other openings), then the penetration of external electromagnetic radiation into the inside of the box can be reduced to arbitrarily small, i.e., negligible, levels. Ideally, an enclosure can be made that provides perfect shielding from external electromagnetic fields.

In some instances, it is desirable to remotely interact with circuits contained within such enclosures. For example, it can be desirable to disrupt the operation of an automobile's engine by remotely interacting with the electronic systems thereof so as to halt a police pursuit.

SUMMARY

Systems and methods are disclosed herein to remotely facilitate modification of the operation of shielded electronics. Such modification of the operation can include the disruption of the electronics. For example, the electronics can be disrupted such that the electronics do not function as intended.

More particularly, in accordance with an example of an embodiment, a method for remotely affecting electronics within a conductive enclosure can comprise transmitting electromagnetic radiation of two different frequencies to the enclosure. The two different frequencies can be selected such that they will penetrate the enclosure and form electromagnetic radiation of a third frequency within the enclosure. The third frequency can be a frequency that is likely to affect the operation of electronic circuitry within the enclosure.

In accordance with an example of an embodiment, a system for remotely affecting electronics within a conductive enclosure can comprise at least one transmitter. The transmitter(s) can be configured to transmit electromagnetic radiation of two different frequencies to the enclosure. Again, the two different frequencies can be selected such that they will penetrate the enclosure and form electromagnetic radiation of a third frequency within the enclosure. The third frequency can be a frequency that is likely to affect the operation of electronic circuitry within the enclosure.

In accordance with an example of an embodiment, a method for assessing vulnerability of electronic systems to electromagnetic attack can comprise subjecting the electronic system to two frequencies of electromagnetic radiation. One of the frequencies can be swept so as to potentially generate similarly swept difference frequencies and/or harmonics of the difference frequencies. Operation of the electronic system can be monitored to determine if the two frequencies have affected the electronic system. The emanation of electromagnetic radiation from the electronic system can be monitored to determine if difference frequencies and/or harmonics of difference frequencies have been generated from the two frequencies.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
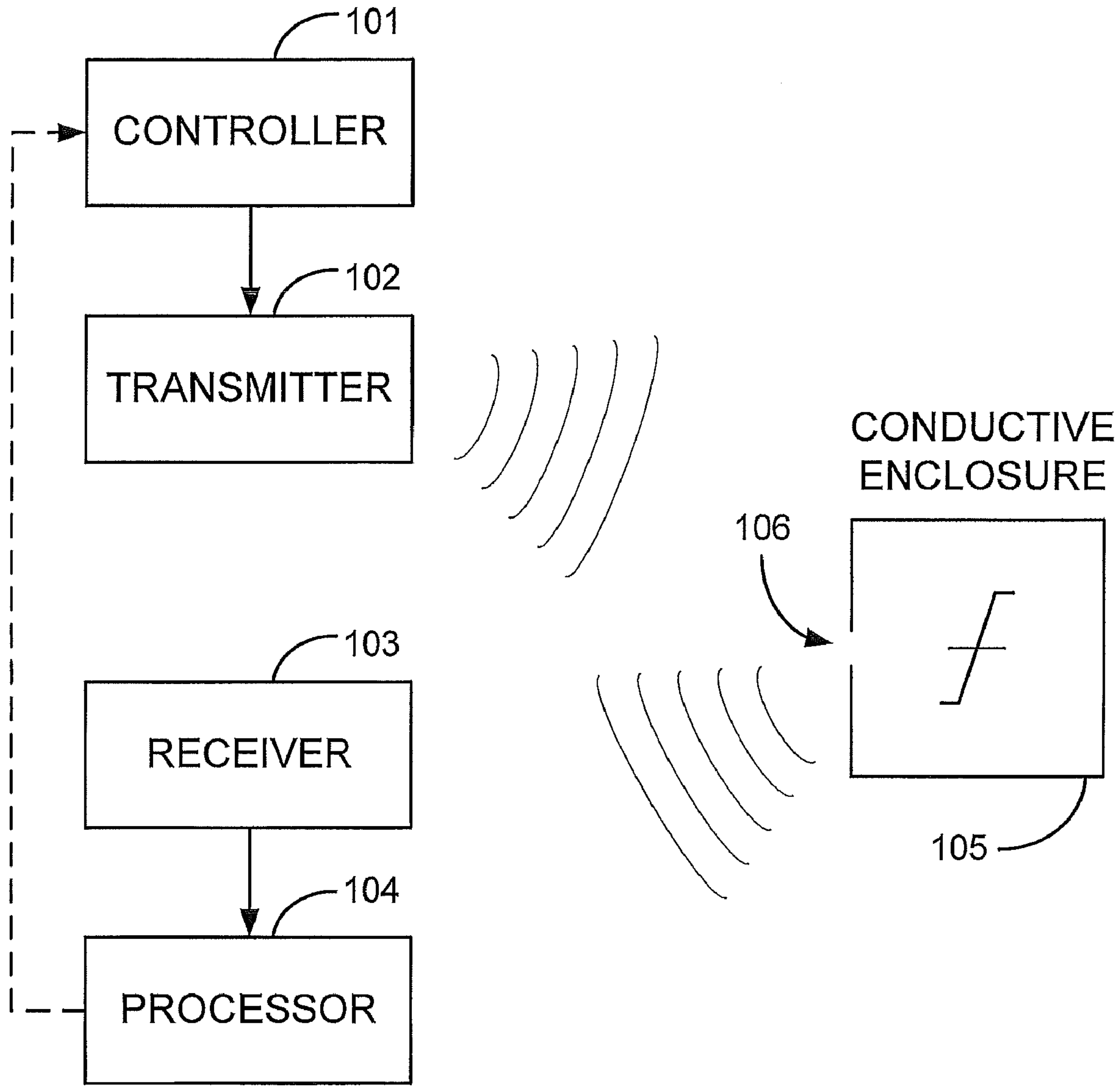
FIG. 1 is a block diagram showing a system for interacting with remote electronics within a conductive enclosure in accordance with an example of an embodiment.

Although an enclosure that provides perfect shielding from external electromagnetic fields can ideally be made, this is often not the case. Enclosures commonly have gaps, holes, or other openings therein. For example, gaps may exist where sides of the enclosure meet. Holes may be provided in the enclosure to allow wires, such as those for power and/or signals, to pass therethrough. Vent slots may be provided for cooling. Such openings are acceptable because they do not generally affect the ability of the enclosure to provide adequate shielding.

According to an example of an embodiment, advantage is taken of such openings to allow the introduction of electromagnetic radiation into the enclosure. Within the enclosure, electromagnetic radiation can interact with electronic devices, electronic circuits, and/or individual electronic components. In this manner, electronic circuits within the enclosure can be remotely affected, e.g., disrupted.

According to an example of an embodiment, electromagnetic radiation of two or more frequencies is directed at the enclosure. These frequencies can be selected such that they penetrate the enclosure. These frequencies can be selected such that they are high enough to penetrate the enclosure via openings of the enclosure. The frequencies of electromagnetic radiation which penetrate the enclosure interact with one another, with the enclosure, and/or with contents of the enclosure to form other frequencies. These other frequencies can affect the operation of the contents of the enclosure.

For example, the two or more frequencies that are directed toward the enclosure can be of comparatively high frequencies. The two or more frequencies of electromagnetic radiation can interact with one another and with non-linear components within the enclosure to form at least one new frequency at one or more differences between pairs of the transmitted frequencies. Harmonics of the difference frequencies can also be formed by the interaction of one or more pairs of the transmitted frequencies with one another and with non-linear components within the enclosure. Such difference frequencies and/or harmonics can be amplified in amplitude by resonances with the enclosure and/or by resonances with contents of the enclosure.

Non-linear components within the enclosure can include non-linear electrical components (such as diodes, transistors, and integrated circuits), dissimilar metals, corrosion, coatings, or any other items that facilitate the formation of new frequencies, e.g., difference frequencies and/or harmonics thereof.

Resonances within the enclosure can result from the geometry of the enclosure and/or from the contents thereof. Resonances within the enclosure can result from electronic circuits within the enclosure.

According to an example of an embodiment, a method and system for remotely affecting electronics within a conductive enclosure can comprise transmitting electromagnetic radiation of two different frequencies to the enclosure. The two different frequencies are selected such that they will penetrate the enclosure and form electromagnetic radiation of a third frequency within the enclosure.

The electromagnetic radiation of the third frequency can affect operation of electronics within the enclosure. For example, the electromagnetic radiation of the third frequency can disrupt the operation of electronics within the enclosure. One example of an application of the use of this method is remotely disabling a fleeing vehicle during a police chase.

The two different frequencies of electromagnetic radiation have wavelengths that are small enough to pass through an opening in the enclosure. For example, the wavelengths can be less than one half the diameter or length of an opening in the enclosure. Thus, a substantial amount of the two different frequencies of electromagnetic radiation penetrates the enclosure.

The two different wavelengths of electromagnetic radiation can be microwaves. Microwaves are electromagnetic waves with wavelengths shorter than one meter and longer than one millimeter and have frequencies between 300 megahertz and 300 gigahertz. The two different frequencies of electromagnetic radiation can have wavelengths of less than 1 millimeter.

The third frequency can be formed at a difference between the two transmitted frequencies and/or at harmonics of the difference frequency. The difference frequency and/or the harmonics can be amplified by the enclosure through resonance(s) and/or the contents of the enclosure and this amplified field can affect operation of the contents of the enclosure.

The two different frequencies can be selected such that a difference frequency therebetween and/or a harmonic of the difference frequency are likely to resonate within the enclosure. More particularly, the two different frequencies can be selected such that a difference frequency therebetween and/or a harmonic of the difference frequency has a wavelength that is approximately equal to an inside dimension of the enclosure. Similarly, the two different frequencies can be selected such that a difference frequency therebetween and/or a harmonic of the difference frequency is resonant with electronics and/or anything else within the enclosure.

According to an example of an embodiment, a method can comprise monitoring electromagnetic radiation transmitted from the enclosure to determine an effect of the electromagnetic radiation transmitted thereto. For example, the method can comprise monitoring electromagnetic radiation transmitted from the enclosure due to the presence of a non-linear circuit element disposed within the enclosure.

Advantage can thus be taken of resonances within an enclosure. That is, the resonant properties of the enclosure itself, as well as of circuits and/or structures contained therein, can be used to allow electromagnetic radiation that penetrates the enclosure and derivative subharmonic fields generated within the enclosure to build up to a point where the electromagnetic radiation can interact with electronic circuits and components within the enclosure. Such resonance can result from any combination of the structure and items contained within the structure.

According to an example of an embodiment, an enclosure is illuminated with two frequencies of electromagnetic radiation. The two frequencies are selected such that the wavelength for difference frequency $\Delta f = f_1 - f_2$ is a wavelength that will resonate within the enclosure. That is, the wavelength is approximately the same as a dimension of the enclosure, is approximately a multiple of a dimension of the enclosure, and/or is approximately a submultiple of a dimension of the enclosure.

Two frequencies can similarly be selected such that the wavelength of the difference frequency excites a resonance of the electronic circuitry with the enclosure. Any desired number of pairs of frequencies can be used to excite any number of such resonances as long as the pairs of frequencies have wavelengths that are short enough to allow penetration into the enclosure. Frequencies can be selected to excite any desired combination of resonances due to dimensions of the enclosure and resonances of electronic circuitry contained therein. For example, one pair of frequencies can excite a resonance of the enclosure and another pair of frequencies can excite a resonance of electronic circuitry within the enclosure.

The formation of difference frequencies can be facilitated by nonlinear elements of electronic circuits within the enclosure. For example, nonlinear elements such as diodes and transistors can cause two different frequencies to mix such that a difference frequency thereof is generated. The generation of such difference frequencies by nonlinear circuit elements is described in U.S. Pat. No. 7,142,147, issued on Nov. 28, 2006 and entitled METHOD AND APPARATUS FOR DETECTING, LOCATING, AND IDENTIFYING MICROWAVE TRANSMITTERS AND RECEIVERS AT DISTANT LOCATIONS, the entire contents of which are hereby expressly incorporated by reference.

According to an example of an embodiment, the particular difference frequency or difference frequencies that resonate within the enclosure can be determined by varying, e.g., sweeping, the second frequency $f_2$. Sweeping the second frequency $f_2$ results in correspondingly sweeping the frequency of $\Delta f$.

Of course, it can be helpful to know approximately a range of physical dimensions of an enclosure so as to facilitate the selection of $f_1$ and so as to facilitate the selection of an appropriate range for sweeping the frequency of $f_2$. For example, if the intent is to stop a fleeing vehicle, then knowledge of the dimensions of the electronic control unit (ECU) of the fleeing vehicle (or of automobiles generally), can better facilitate the selection of the frequencies of electromagnetic radiation to be transmitted. The ECU of an automobile is generally a computer and can be vulnerable to attach by electromagnetic radiation.

An example of an embodiment can be used to assess the vulnerability of electronic systems to such attack with electromagnetic radiation. For example, a system can be subjected to two frequencies of electromagnetic radiation wherein one of the frequencies is swept so as to potentially generate a range of difference frequencies. The operation of the system can be monitored to determine if the electromagnetic radiation has an affect, such as an adverse affect, thereon. Electromagnetic radiation from the system can be monitored to determine if difference frequencies and/or harmonics of difference frequencies are radiated therefrom, thus indicating a potential vulnerability of the system.

The difference frequency for the two or more frequencies of electromagnetic radiation that are directed toward the enclosure can be equal to one or more of the resonant frequencies of the enclosure. Thus, the enclosure can function as a microwave cavity with relatively high Q. The electromagnetic field strength of any difference frequencies created by nonlinear components within the enclosure can thus be amplified or enhanced substantially.

The circuitry inside of the enclosure can have its own set of resonances, which can be completely separate and independent with respect to the microwave cavity resonances of the enclosure. The resonances of such electronics are typically at lower frequencies that the resonances of the enclosure. For example, resonances of electronic circuitry can be in the megahertz and tens of megahertz range, while resonances of microwave cavities defined by enclosures can be in the gigahertz range.

Microwave cavity resonances, in the case of a rectangular metal cavity with dimensions a, b, and c are given by:

$$\lambda_0=4/[(l/a)^2+(m/b)^2+(n/c)^2]^{1/2}$$

where l is the number of half-wave variations of field along the x-axis, m is the number of half-wave variations of field along the y-axis, n is the number of half-wave variations of the field along the 3rd dimension, and l, m and n are integers (0, 1, 2, 3, . . . ). Not more than one of these integers may equal to zero for fields to exist.

For large resonators of this type (larger than the wavelength of the difference frequency, $\Delta f$) the number of modes dN in a range of wavelength $d\lambda$ is:

$$dN = 8\pi\frac{V}{\lambda_1^4}d\lambda$$

where V is the volume of the resonator and $\lambda_1$ is the center of the wavelength band, $d\lambda$.

As an example, consider a resonator (a metal box) in which a=b and where l=m=1 and n=0. The resonant wavelength of such a resonator is:

$$\lambda_0=2\sqrt{2}a$$

or (as an example) in the case of a 4" square box: $\lambda_0$(10×10 cm)=2.83a=28.28 cm, and resonant frequency $f_0$=1.06 GHz. This is the lowest resonant frequency.

The Q of this resonator is given by $$Q(\delta/\lambda_0)=0.353/[1+(a/2c)]$$

where the skin-depth (in cm) is $$\delta = \frac{1}{2\pi}\sqrt{\frac{\lambda\rho}{30\mu}};$$

$\rho$=resistivity of the metal wall of the box, and $\mu$=permeability

For copper the permeability is unity, the resistivity is $\rho$=1.72×10−6 ohm-cm. Skin depth $\delta$=1.72μ at $\lambda$=10 cm.

For large cubical resonators, in which a=b=c for resonators, operating in a high mode of oscillation, the Q is approximately given by:

$$Q\frac{\delta}{\lambda_0} = \frac{a}{2\lambda_0}$$

According to an example of an embodiment, the difference frequency, $\Delta f$ can be modulated (using either AM or FM modulation) by a frequency (or frequencies) which are Eigen frequencies of the electronic circuits within the enclosure. The difference frequency can be modulated by modulating one or both of the transmitted frequencies. Eigen frequencies are frequencies at which the electronic circuits inside the enclosure are resonant. These modulated difference signals are typically in the megahertz range. The modulated difference signals are then absorbed by the circuit, thereby inducing interference signals in these circuits in a manner that can interfere with normal operation of the circuit.

At high enough levels of currents induced by this method, saturation of the electronic components can occur. Such saturation can result in a temporary malfunction of the electronic circuits. At still higher levels of induced currents, irreversible (permanent) damage to components will result.

Referring now to FIG. 1, a controller 101 provides control signals to at least one transmitter 102. The control signals determine what frequencies are transmitted. At least one pair of frequencies is transmitted. More than one pair of frequencies can be transmitted simultaneously, if desired. Any desired number of frequencies can be transmitted either simultaneously or in any desired sequence.

A single transmitter 102 can transmit some or all of the frequencies simultaneously. Alternatively, more than one transmitter 102 can be used. For example, each frequency can be transmitted by a separate transmitter 102.

The controller 101 can cause the transmitter 102 to transmit the same frequency continuously, to transmit a series of discrete frequencies, to sweep frequencies, and/or to transmit in any other desired manner. Either one, both (if there are only two), or more than two (if there are more than two) frequencies can be varied. One or more frequencies can be held constant while one or more frequencies are varied.

The controller 101 can use closed loop feedback control to determine what frequencies are transmitted. The controller 101 can receive a signal that is determined by the effectiveness of the transmission to affect electronics and can use this signal to facilitate control of the frequencies transmitted.

For example, the transmitter 102 can transmit two frequencies of electromagnetic radiation toward conductive enclosure 105. The frequencies are high enough such that they both penetrate the enclosure, such as through opening 106 therein. For example, the wavelength of each of the two frequencies can be less than one half of the diameter of opening 106.

The enclosure 105 can contain electronics. The electronics can comprise non-linear components (as indicated by the non-linear component symbol within the enclosure 105). The non-linear electronic components can facilitate the re-radiation of electromagnetic radiation from the enclosure 105.

According to an example of an embodiment, the re-radiated electromagnetic radiation can be received by receiver 103 and analyzed by processor 104. Processor 104 can determine how effective the electromagnetic radiation from transmitter 102 is at interacting with the electronics within enclosure 105.

More particularly, as at least one frequency of the electromagnetic radiation from transmitter 102 can be varied and the effect upon the electronics within enclosure 105 can be monitored. Processor 104 can provide a signal to controller 101 that is representative of the effectiveness of the transmitted frequencies in affecting the electronics within enclosure 105 such that closed loop feedback control of transmitter 102 is provided. In this manner, feedback can be used to enhance the effectiveness of electromagnetic radiation from transmitter 102 to affect the electronics within enclosure 105.

Figure 2:
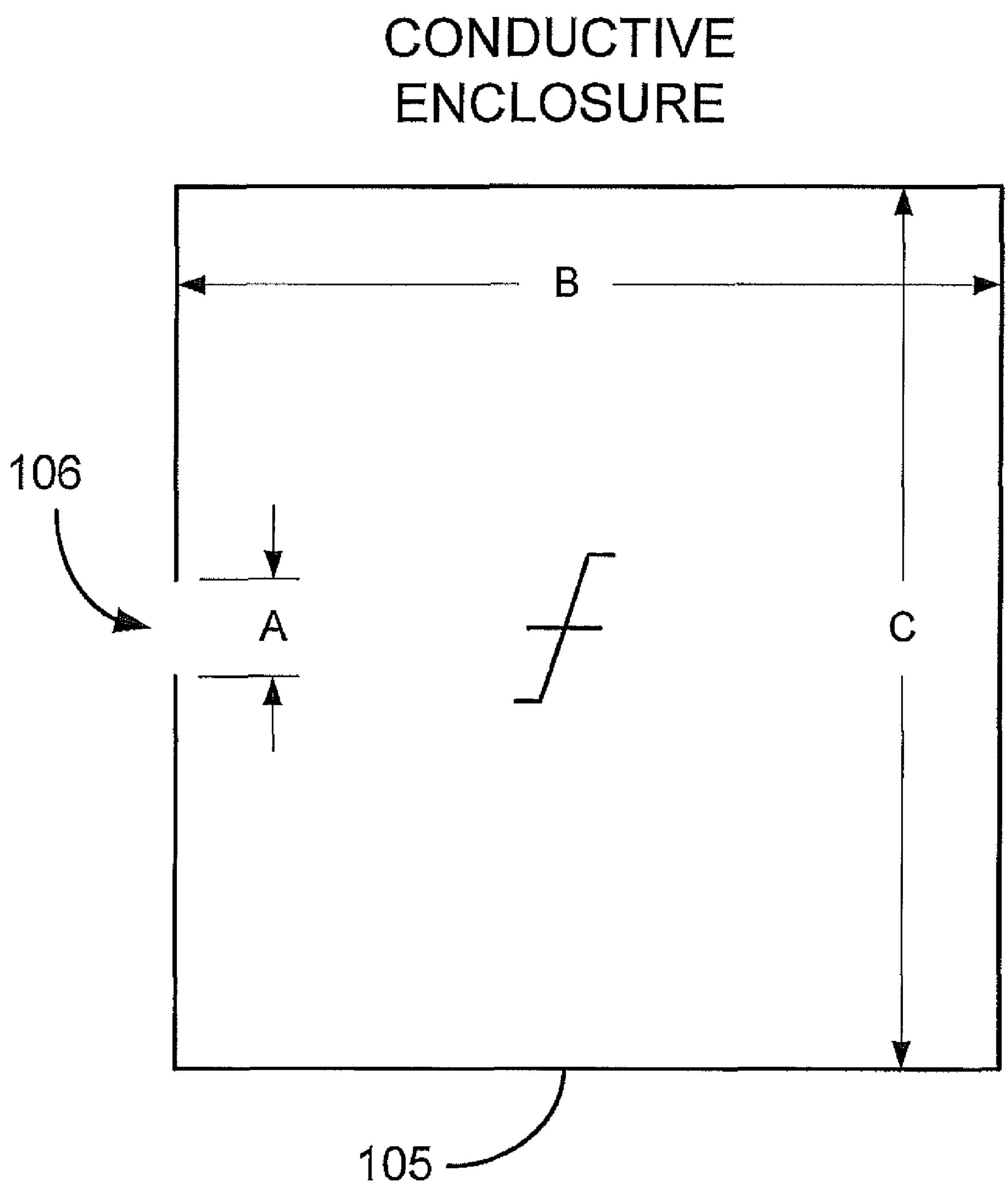
FIG. 2 is a block diagram of the enclosure of FIG. 1 showing dimensions thereof, in accordance with an example of an embodiment.

Referring now to FIG. 2, enclosure 105 can be a metal box having an opening 106 of dimension A and also having dimensions of B and C, for example (no third dimension is needed for this example). The enclosure can be any type of shielding including conductive boxes, shielded cables, buildings, vehicle chassis and bodies, spacecraft bodies, missile coverings, and aircraft coverings.

Opening 106 can exist for any reason. For example, it can be for ventilation or for wires to pass through. It can be due to manufacturing tolerances, misalignment of parts, material defects or assembly mistakes (such as not using a mounting screw in an available screw hole).

The frequencies from the transmitter 102 of FIG. 1 are selected such that they can penetrate into the interior of conductive enclosure 105, such as through opening 106. Generally, higher frequencies are needed so as to penetrate via smaller openings (openings that have a smaller dimension A).

Inside of enclosure 105, at least two frequencies from the transmitter 102 of FIG. 1 interact with one another to form a difference frequency. More than two frequencies can be transmitted from transmitter 102 and more than one difference frequency can be formed. Harmonics of the difference frequencies can also result from the interaction of the two transmitted frequencies.

For some pairs of frequencies, the difference frequencies can resonate within the enclosure 105. For example, when either dimension B, dimension C, or some other dimension of the enclosure 105 is approximately equal to the wavelength, a multiple of the wavelength, or a sub-multiple of the wavelength, of a difference frequency or a harmonic of a difference frequency, then such resonance can occur. Resonances can also occur due to electronics within the enclosure 105.

Figure 3:
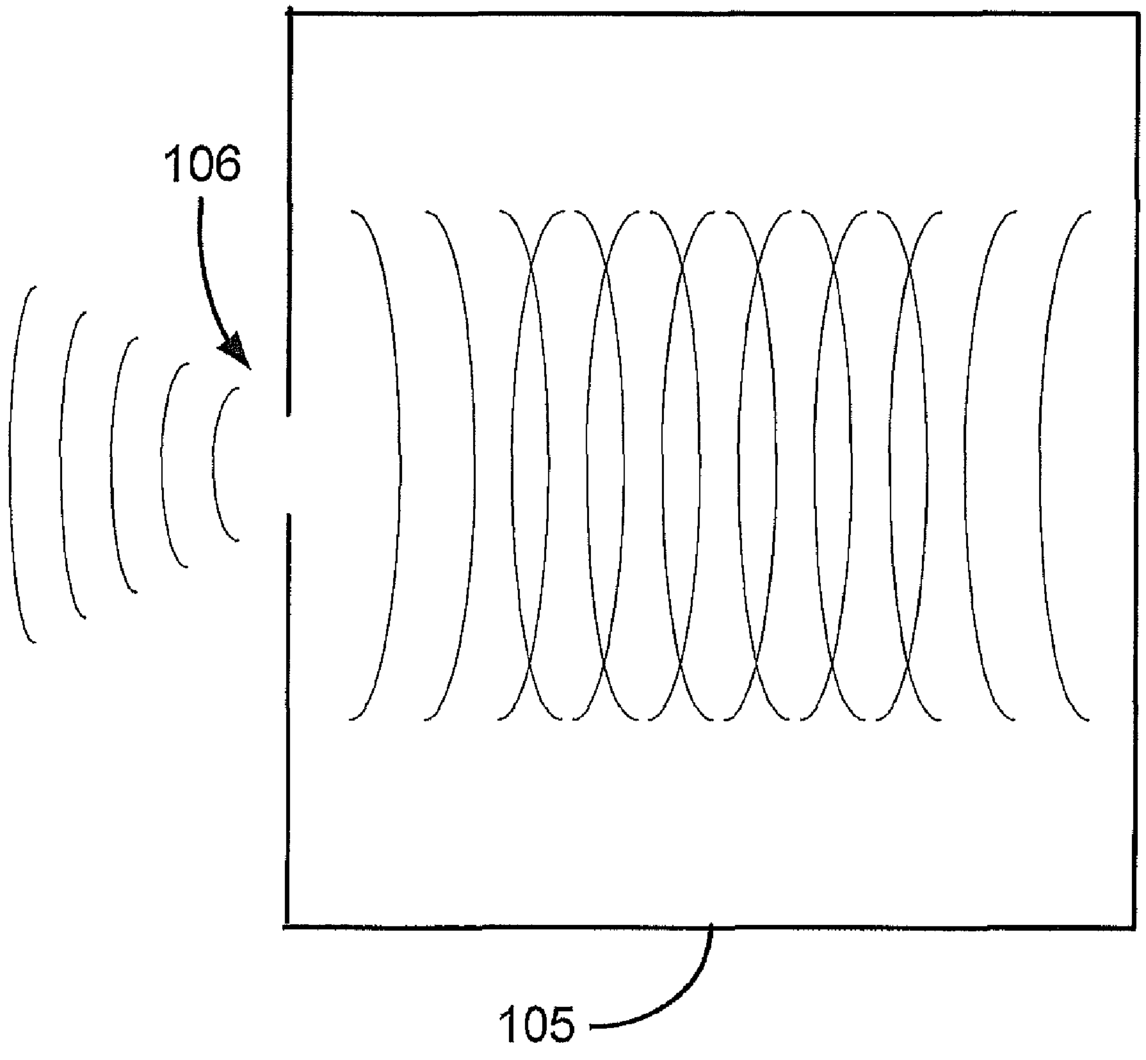
FIG. 3 is a block diagram of the enclosure of FIG. 1 showing a resonance formed therein and showing electromagnetic radiation at the resonant frequency (generally a difference frequency and/or harmonics of the difference frequency) leaking therefrom, in accordance with an example of an embodiment of the present invention.

Referring now to FIG. 3, such resonances can allow the difference frequency to build to a sufficient level that it affects the operation of electronics within the enclosure 105. Indeed, the field strength in the enclosure at the difference frequency can build to a level that disrupts operation of the electronics.

Some portion of the difference frequency can leak from the enclosure, such as via opening 106. However, sometimes the difference frequency itself will have a wavelength that is too long to facilitate substantial leakage from the enclosure. For example, the wavelength can be too long to escape appreciably from opening 106 (which can be small compared to the wavelength of the difference frequency).

Interactions of the difference frequency with electronics within the enclosure can result in the formation of higher harmonics of the difference frequency that can more readily escape via smaller openings, such as opening 106. Any electromagnetic radiation that escapes from enclosure 105 and that can be received by receiver 103 can be analyzed by processor 104 to aid in a determination of the effectiveness of electromagnetic radiation from transmitter 102 in interacting with the electronics within enclosure 105.

Figure 4:
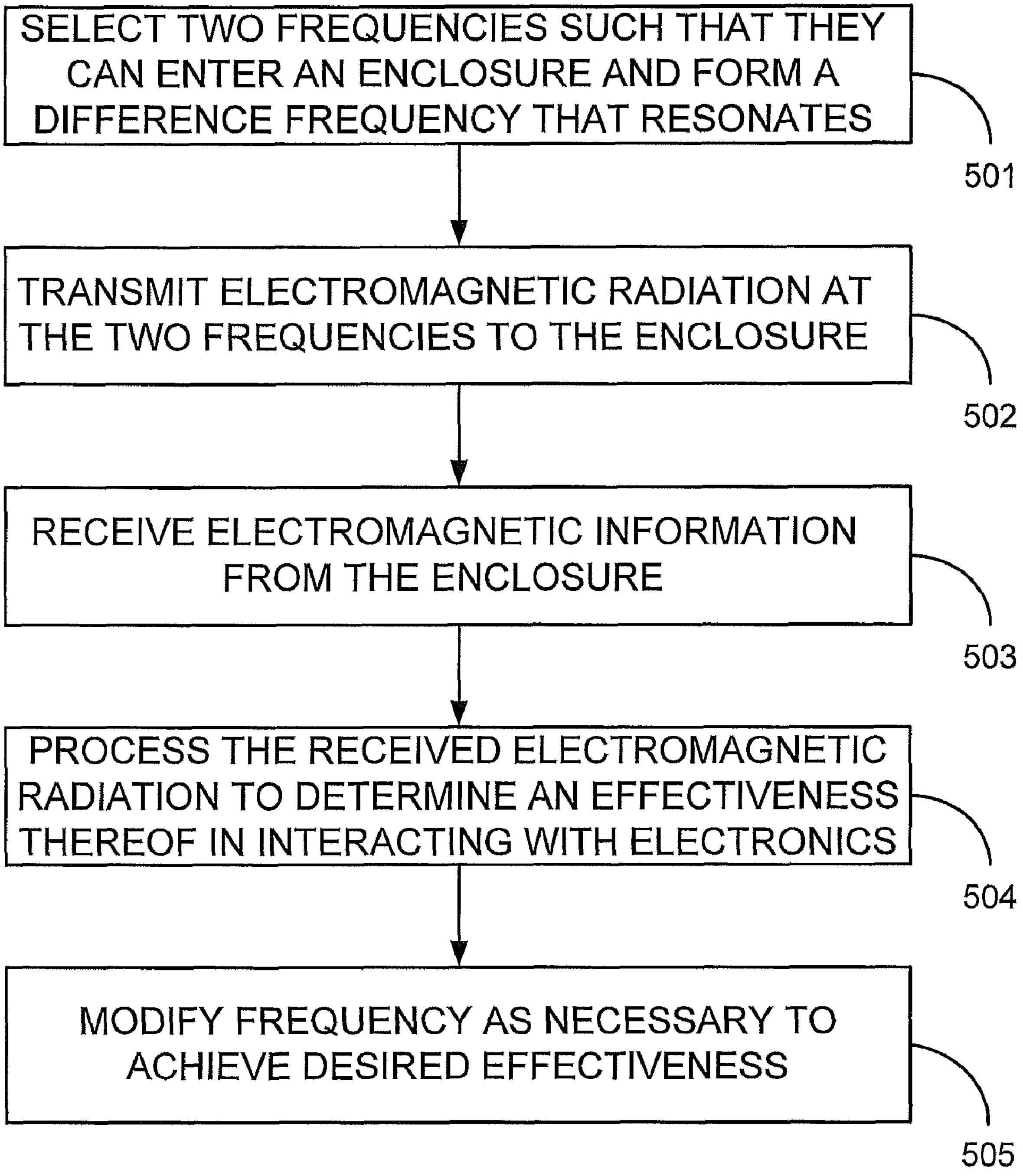
FIG. 4 is a flow chart showing operation of a system for interacting with remote electronics within a conductive enclosure in accordance with an example of an embodiment.

Referring now to FIG. 4, two frequencies are selected such that they can enter an enclosure and form a difference frequency that resonates therein, as indicated in block 501. Of course, knowledge of the enclosure, such as the dimensions thereof, as well as the presence and dimensions of any openings therein, aids in the selection of such frequencies. Lacking adequate knowledge of the enclosure, at least one frequency can be varied while monitoring operation of the electronics and/or monitoring electromagnetic radiation reradiated (escaping) from the enclosure.

Electromagnetic radiation of at least two frequencies is transmitted to the enclosure, as indicated in block 502. Optionally, electromagnetic radiation from the enclosure is monitored, as indicted in block 503. The received electromagnetic radiation can be processed to facilitate a determination of the effectiveness thereof in interacting with the electronics within the enclosure, as indicated in block 504. At least one frequency of electromagnetic radiation transmitted to the enclosure can be varied so as to enhance the effectiveness thereof in interacting with the electronics, as discussed in block 505.

Examples of applications include interfering with the operation of and/or disrupting the operation of automobiles, cellular telephones, battlefield communications equipment, missiles, surveillance satellites, and improvised explosive devices.

Benefits include the ability to affect the operation of remote devices, such as electronic devices. The devices can be affected in a manner that inhibits their normal operation. At least in some instances, the devices can resume normal operation once the application of electromagnetic radiation has ceased.

Embodiments described above illustrate but do not limit the invention. It should also be understood that numerous modifications and variations are possible in accordance with the principles of the present invention. Accordingly, the scope of the invention is defined only by the following claims.

We claim:

1. A method for remotely affecting electronics within a conductive enclosure, the method comprising:

transmitting electromagnetic radiation of two different frequencies to the enclosure; and wherein the two different frequencies are selected such that they will penetrate the enclosure and form electromagnetic radiation of a third frequency within the enclosure.

2. The method as recited in claim 1, wherein the two different frequencies of electromagnetic radiation have wavelengths that are small enough to pass through an opening in the enclosure.

3. The method as recited in claim 1, wherein the third frequency is formed at a difference between the two transmitted frequencies.

4. The method as recited in claim 1, wherein the two different frequencies are selected such that a difference frequency therebetween resonates within the enclosure.

5. The method as recited in claim 1, wherein the two different frequencies are selected such that a difference frequency therebetween has a wavelength that is approximately equal to an inside dimension of the enclosure.

6. The method as recited in claim 1, wherein the two different wavelengths are selected such that a difference frequency therebetween resonates in a circuit of the electronics.

7. The method as recited in claim 1, wherein the third frequency is a difference frequency of the transmitted electromagnetic radiation and further comprising modulating the difference frequency at a frequency which is an Eigen frequency of an electronic circuit within the enclosure.

8. The method as recited in claim 1, further comprising monitoring electromagnetic radiation transmitted from the enclosure to determine an effect of the electromagnetic radiation transmitted thereto.

9. The method as recited in claim 1, further comprising monitoring electromagnetic radiation transmitted from the enclosure due to the presence of a non-linear circuit element disposed within the enclosure.

10. The method as recited in claim 1, wherein the two different frequencies are selected such that a difference therebetween disrupts the electronics.

11. A system for remotely affecting electronics within a conductive enclosure, the system comprising:

at least one transmitter, the transmitter(s) being configured to transmit electromagnetic radiation of two different frequencies to the enclosure; and wherein the two different frequencies are selected such that they will penetrate the enclosure and form electromagnetic radiation of a third frequency within the enclosure.

12. The system as recited in claim 11, wherein the two different frequencies of electromagnetic radiation have wavelengths that are small enough to pass through an opening in the enclosure.

13. The system as recited in claim 11, wherein the third frequency is formed at a difference between the two transmitted frequencies.

14. The system as recited in claim 11, wherein the two different frequencies are selected such that a difference frequency therebetween resonates within the enclosure.

15. The system as recited in claim 11, wherein the two different frequencies are selected such that a difference frequency therebetween has a wavelength that is approximately equal to an inside dimension of the enclosure.

16. The system as recited in claim 11, wherein the two different wavelengths are selected such that a difference frequency therebetween resonates in a circuit of the electronics.

17. The system as recited in claim 11, further comprising monitoring electromagnetic radiation transmitted from the enclosure to determine an effect of the electromagnetic radiation transmitted thereto.

18. The system as recited in claim 11, further comprising monitoring electromagnetic radiation transmitted from the enclosure due to the presence of a non-linear circuit element disposed within the enclosure.

19. A system for remotely affecting electronics within a conductive enclosure, the system comprising:

means for selecting two different frequencies;

means for transmitting electromagnetic radiation of two different frequencies to the enclosure; and wherein the two different frequencies are selected such that they will penetrate the enclosure and form electromagnetic radiation of a third frequency within the enclosure.

20. A method for assessing vulnerability of electronic systems to electromagnetic attack, the method comprising:

subjecting the electronic system to two frequencies of electromagnetic radiation, wherein one of the frequencies is varied;

monitoring at least one of the following:

operation of the electronic system to determine if the two frequencies have affected the electronic system; and radiation of electromagnetic radiation from the electronic system to determine if difference frequencies and/or harmonics of difference frequencies have been generated from the two frequencies.

* * * * *